(12) United States Patent
Mottaez et al.

(10) Patent No.: US 8,843,871 B2
(45) Date of Patent: Sep. 23, 2014

(54) ESTIMATING OPTIMAL GATE SIZES BY USING NUMERICAL DELAY MODELS

(75) Inventors: Amir H. Mottaez, Los Altos, CA (US); Mahesh A. Iyer, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 50 days.

(21) Appl. No.: 13/537,880

(22) Filed: Jun. 29, 2012

(65) Prior Publication Data

US 2014/0007037 A1    Jan. 2, 2014

(51) Int. Cl.
*G06F 17/50* (2006.01)

(52) U.S. Cl.
USPC ............................ 716/132; 716/101; 716/134

(58) Field of Classification Search
USPC .................. 716/100–108, 111–115, 132–134
See application file for complete search history.

(56) References Cited

U.S. PATENT DOCUMENTS

2004/0034844 A1* 2/2004 Beerel et al. ................... 716/18
2009/0254874 A1* 10/2009 Bose ................................ 716/6

* cited by examiner

*Primary Examiner* — Paul Dinh
(74) *Attorney, Agent, or Firm* — Park, Vaughan, Fleming & Dowler LLP; Laxman Sahasrabuddhe (57) ABSTRACT

Systems and techniques are described for estimating optimal gate sizes in a circuit design using numerical delay models of cells and cell types in a technology library. Gate sizes are optimized in the circuit design in a reverse-levelized processing order. Gates that are at the same level in the reverse-levelized processing order, and whose inputs are electrically connected to the same driver output are optimized together. A closed-form expression is used to determine the optimized size for each gate in a set of gates that are optimized together. Some embodiments perform multiple optimization iterations, wherein in each optimization iteration all of the gates in the circuit design are processed in the reverse-levelized processing order. The iterative optimization process terminates when one or more termination conditions are met.

18 Claims, 6 Drawing Sheets

FIG. 7

ESTIMATING OPTIMAL GATE SIZES BY USING NUMERICAL DELAY MODELS

BACKGROUND

1. Technical Field

This disclosure relates to electronic design automation (EDA). More specifically, this disclosure relates to estimating optimal gate sizes by using numerical delay models.

2. Related Art

The goal of circuit synthesis is to convert a high-level description of a circuit design into an implementation that meets a set of timing constraints, and at the same time optionally optimizes one or more metrics, such as area, leakage power, etc.

Some circuit synthesis approaches create an initial circuit design at a given abstraction level (e.g., a logical or physical design). Next, a cell is identified in the circuit design for optimization based on the metrics that are desired to be optimized. An optimal size for the identified cell is then determined by iteratively replacing the identified cell with functionally equivalent cells that have different sizes (this optimization process is also referred to as "sizing the cell," "sizing the gate," etc.). For each replacement cell size that is tried, the circuit synthesis approach updates timing information, and rejects cell sizes for which one or more timing constraints are violated. The iterative optimization process typically terminates after the optimization process has executed for a certain number of iterations or for a certain amount of time.

Unfortunately, such iterative trial-and-error based circuit synthesis approaches either take too long to complete and/or produce poor quality results for large circuit designs in which timing constraints are checked across many process corners and modes.

A circuit synthesis approach that is different from iterative trial-and-error approaches is described in Ivan Sutherland, Robert F. Sproull, and David Harris, *Logical Effort: Designing Fast CMOS Circuits*, Morgan Kaufmann, 1999. This approach uses the following linear cell delay model:

$$d = g \cdot h + p, \quad (1)$$

where, $g$ represents the logical effort, $h$ represents the electrical effort, and $p$ represents the parasitic delay of the cell. The logical effort captures the effect of the cell's topology on its ability to produce output current. The logical effort is independent of the size of the transistors in the circuit. The electrical effort describes how the electrical environment of the cell affects performance, and how the size of the transistors in the cell determines its load-driving capability. The parasitic delay is a form of delay overhead that accompanies any gate.

Equation (1) can be rewritten as:

$$d = R \cdot C_o + p, \quad (2)$$

where, $R$ is the output resistance of the cell, $C_o$ is the output loading, and $p$ is the parasitic delay of the cell. Equation (2) can then be rewritten as:

$$d = (R \cdot C_i) \cdot \left(\frac{C_o}{C_i}\right) + p, \quad (3)$$

where, $C_i$ is the input capacitance presented by the cell at one of its input terminals. The first term $(R \cdot C_i)$ represents the logical effort $g$, and the second term $$\left(\frac{C_o}{C_i}\right)$$

represents the electrical effort $h$. The logical effort $g$ and the parasitic delay $p$ can be normalized, e.g., they can be normalized with respect to the logical effort and parasitic delay values, respectively, of a reference inverter.

The delay model that is used by a circuit synthesis approach must be accurate, i.e., it must accurately model the actual cell delays. If the delay model is inaccurate, the circuit implementation produced by the circuit synthesis approach will likely contain many timing violations.

In the above-mentioned work by Sutherland et al., the authors state that the linear delay model is approximate, and it does not accurately model the actual cell delays. Even if an accurate linear cell delay model is used in an iterative trial-and-error based circuit optimization process, the circuit optimization process could still take too long to complete and/or produce poor quality results for large circuit designs in which timing constraints are checked across many process corners and modes.

SUMMARY

Some embodiments described herein provide techniques and systems for estimating optimal gate sizes in a circuit design using numerical delay models of cells and cell types in a technology library. In some embodiments, gate sizes are optimized in the circuit design in a reverse-levelized processing order. Some embodiments perform multiple optimization iterations, wherein in each optimization iteration all of the gates in the circuit design are processed in the reverse-levelized processing order. The iterative optimization process can be terminated when one or more termination conditions are met, e.g., when the change in the gate sizes from one iteration to the next is negligible, and/or when the number of iterations has reached an iteration limit.

Gates that are at the same level in the reverse-levelized processing order, and whose inputs are electrically connected to the same driver output are optimized together. A closed-form expression is used to determine the optimized size for each gate in a set of gates that are optimized together.

The set of closed-form expressions use the following circuit information: (1) generic logical effort values of each gate in the set of gates, (2) an input capacitance value and a specific logical effort value of a driver gate that drives one or more inputs of each gate in the set of gates, (3) a wire resistance value of a net that electrically connects an output of the driver gate with one or more inputs of each gate in the set of gates, and optionally (4) a generic logical effort value for a virtual driver gate, and a fixed load value as seen by the virtual driver gate (the fixed load value is equal to a sum of input capacitances of gates that are not in the set of gates that is currently being optimized but whose inputs are electrically connected to the output of the driver gate).

The wire resistance value of the net can be determined based on the wire model that is being used in the circuit optimization process. For example, in some embodiments, the wire resistance value of the net is determined using an Elmore wire delay model.

In some embodiments, the gate sizes that are determined by evaluating the closed-form expressions are used as is, i.e., these gate sizes are treated as the optimal gate sizes. In some embodiments, if the gate sizes that are determined by evaluating the closed-form expressions are optimal, then they are used as is; otherwise they are provided as seed values to a numerical solver that solves for optimal gate sizes.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein. In this disclosure, when the term "and/or" is used with a list of entities, it refers to all possible combinations of the list of entities. For example, the phrase "X, Y, and/or Z" covers the following cases: (1) only X; (2) only Y; (3) only Z; (4) X and Y; (5) X and Z; (6) Y and Z; and (7) X, Y, and Z.

Overview of an Electronic Design Automation (EDA) Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are illustrative purposes only and are not intended to limit the embodiments to the forms disclosed.

Some EDA software tools enable circuit designers to describe the functionality that they want to implement. These tools also enable circuit designers to perform what-if planning to refine functionality, check costs, etc. During logic design and functional verification, the HDL (hardware description language), e.g., SystemVerilog, code for modules in the system can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout (placement) and can be electrically coupled (routing).

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Numerical Synthesis

Figure 1:
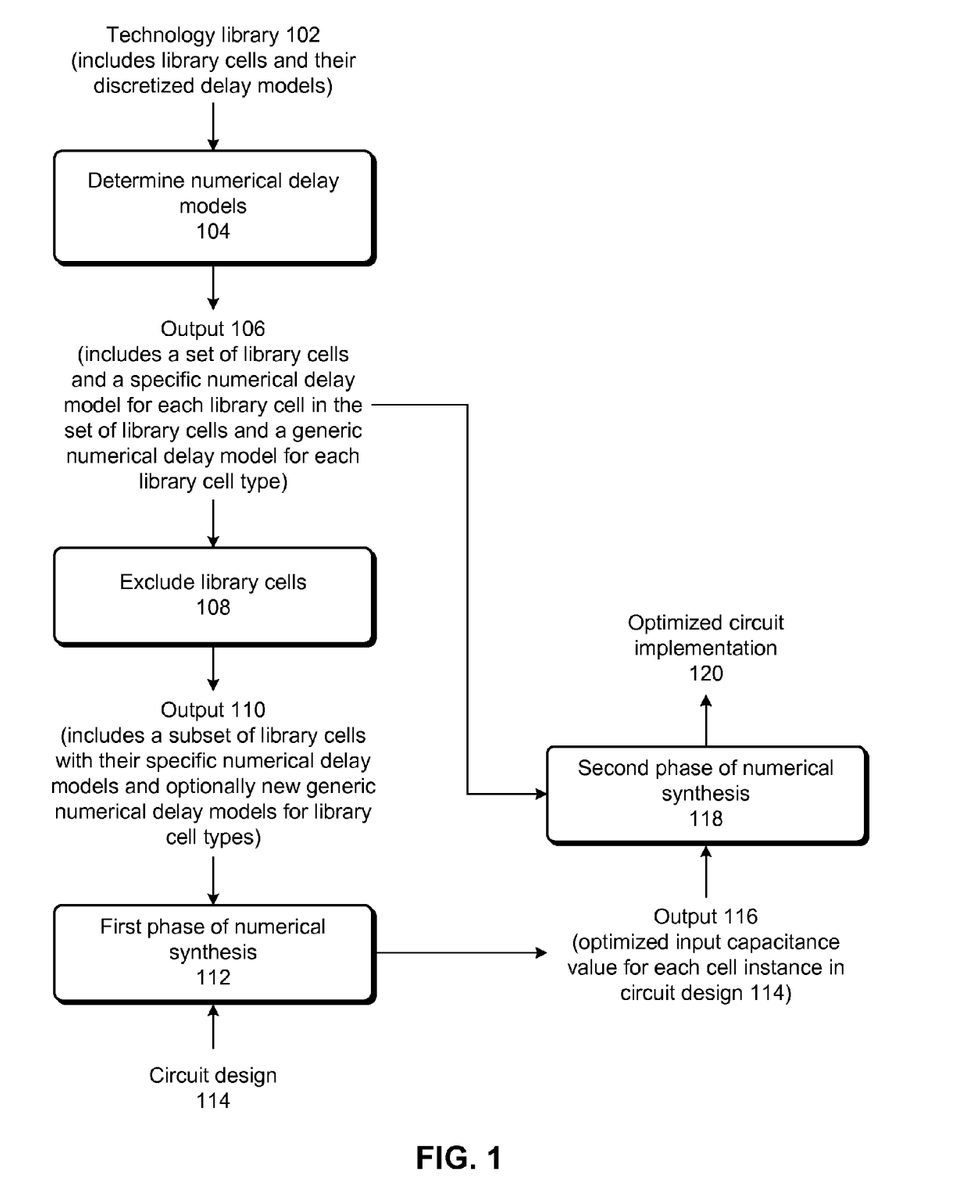
FIG. 1 illustrates a numerical synthesis process in accordance with some embodiments described herein.

FIG. 1 illustrates a numerical synthesis process in accordance with some embodiments described herein.

Technology library 102 includes library cells and discretized delay models for the library cells. The library cells in technology library 102 can be used to create and/or optimize a circuit design. The term "library cell" refers to a cell in a technology library. The term "library cell" is to be distinguished from the term "cell instance" which is an instantiation of a library cell in a circuit design. In some embodiments, a discretized delay model models the delay for a timing arc of a library cell.

The term "library cell type" refers to a particular logical functionality. Examples of functionalities include, but are not limited to, "AND," "OR," "XOR," "multiplexor," etc. The term "library cell" refers to a particular implementation of a library cell type. A technology library can be viewed as a collection of library cells of one or more library cell types. For example, a technology library may include multiple sizes of an inverter. In this example, the term "inverter" is the library cell type, and the term "library cell" refers to an inverter implementation of a particular size.

A numerical delay model is a delay model that can be used by a numerical solver to optimize a cost function. A linear delay model is one example of a numerical delay model. More generally, an analytical formula that represents the delay behavior is an example of a numerical delay model.

The term "specific numerical delay model" refers to a numerical delay model that models the delay behavior of a particular timing arc of a particular library cell, or the delay behavior of a particular library cell. A specific numerical delay model is defined using a specific logical effort value and a specific parasitic delay value.

The term "generic numerical delay model" refers to a numerical delay model that models an aggregated delay behavior of either a timing arc of a library cell type or the library cell type itself. A generic numerical delay model is defined using a generic logical effort value and a generic parasitic delay value.

Examples of systems and techniques that can be used to determine specific and generic numerical delay models (which can be used to perform operation 104) are described in U.S. patent application Ser. No. 13/450,178, entitled "Numerical delay model for a technology library cell and/or a technology library cell type," the contents of which are herein incorporated by reference in their entirety.

Some embodiments determine numerical delay models based on technology library 102 (operation 104). Output 106 of operation 104 can include a set of library cells and a specific numerical delay model for each library cell in the set of library cells and a generic numerical delay model for each library cell type. The set of library cells in output 106 typically includes all library cells in technology library 102, but in some embodiments certain library cells may be removed if desired.

Certain library cells can then be excluded (operation 108) to obtain a subset of library cells. Each library cell in the subset of library cells has a specific numerical delay model that was computed in operation 104. In some embodiments, a new generic numerical delay model can be determined for each cell type based on the specific numerical delay models corresponding to the subset of library cells. These generic numerical delay models are "new" because they are based on the subset of library cells as opposed to being based on the set of library cells that were used in operation 104 to determine the generic numerical delay models. Output 110, i.e., the subset of library cells with their specific numerical delay models and optionally the new generic numerical delay models for the library cell types, can then be provided as input to the first phase of numerical synthesis 112.

Examples of systems and techniques that can be used to exclude library cells (which can be used to perform operation 108) are described in U.S. patent application Ser. No. 13/479, 807, entitled "Excluding library cells for delay optimization in numerical synthesis," the contents of which are herein incorporated by reference in their entirety.

The first phase of numerical synthesis 112 sizes cells in circuit design 114 using the subset of library cells with their specific numerical delay models and the new generic numerical delay models. In some embodiments, the first phase of numerical synthesis 112 models a numerical optimization problem based on circuit design 114 and the specific and generic numerical models for the subset of library cells. Output 116 from the first phase of numerical synthesis 112 includes the numerically optimized size for each cell instance in circuit design 114. Specifically, in some embodiments, output 116 includes the numerically optimized (and desired) input capacitance value for each cell instance in the circuit design 114.

Output 116 is then provided as one of the inputs to the second phase of numerical synthesis 118. The other input to second phase of numerical synthesis 118 is output 106 which includes the set of library cells that were generated by operation 104. The second phase of the numerical synthesis 118 then instantiates cells that have the numerically optimized and desired cell sizes in circuit design 114 to produce optimized circuit implementation 120 using the discrete library cells from the technology library. In particular, for each cell instance in circuit design 114, the second phase of numerical synthesis 118 selects a library cell that best matches the numerically optimized size, (if a library cell with exactly the optimized size is not available, a library cell with nearly the optimized size is selected) from the set of library cells that were part of output 106.

The reason a subset of library cells is used in the first phase and the set of library cells is used in the second phase is as follows. The first phase determines numerically optimized cell sizes by solving a numerical optimization problem. In this phase, it is desirable to restrict the search space to library cells that can be accurately modeled using a logical effort and parasitic delay based numerical modeling approach. Therefore, a subset of library cells is used in this phase to restrict the search space. Once the numerically optimized cell sizes have been determined, it is important to enable the circuit synthesis process to select cell instances from a wide range of library cells. Therefore, in the second phase, the restriction on the search space is relaxed and the set of library cells that was in output 106 is used.

Some embodiments described herein optimize gates in a reverse-levelized order. Each logic gate is associated with a level so that each logic gate's level is greater than the highest level associated with logic gates that are electrically coupled to the logic gate's fan-in. Optimizing gates in reverse-levelized order means that the gates are optimized in decreasing order of their levels, i.e., a gate at level n−1 will only be optimized after all gates at level n have been optimized. Gates at the same level may be optimized in any arbitrary order.

Figure 2:
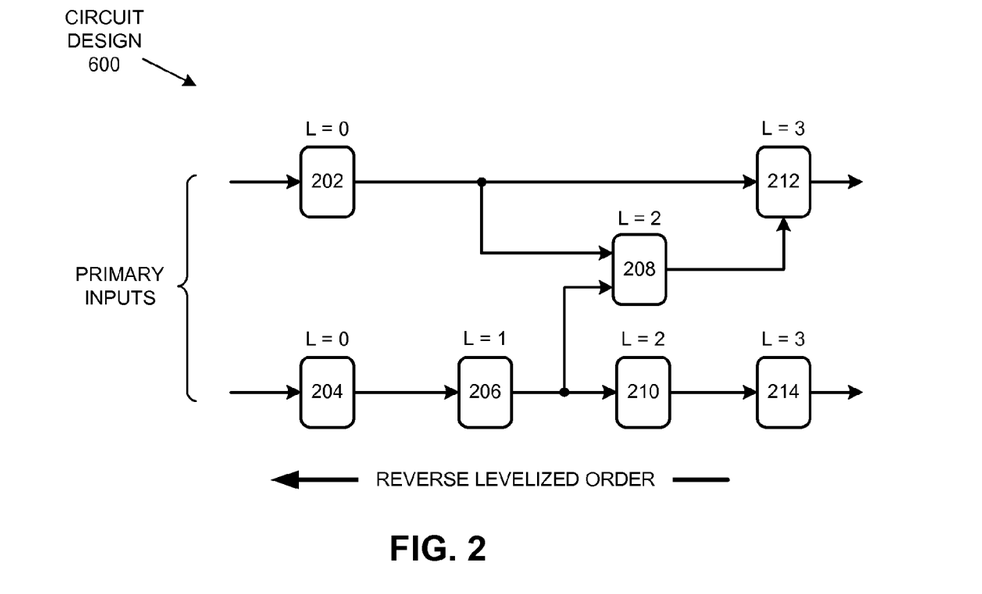
FIG. 2 illustrates a reverse-levelized processing order in accordance with some embodiments described herein.

FIG. 2 illustrates a reverse-levelized processing order in accordance with some embodiments described herein. In the figure, the notation "L=n," where n is a number denotes that the level associated with the logic gate is equal to n. Circuit design 200 includes logic gates 202-214 that have been assigned levels 0 through 3. Logic gates 202-204, whose fan-in is coupled to a primary input of the circuit design, are assigned level 0. All other logic gates are assigned a level that is greater than the highest level associated with the logic gates that are electrically coupled to the logic gate's fan-in. For example, logic gate 206 is assigned level 1, logic gates 208-210 are assigned level 2, and logic gates 212-214 are assigned level 3. In a reverse-levelized optimization order, the optimization process optimizes logic gates in decreasing order of their levels. For example, some embodiments described herein would optimize logic gates 212 and 214 before optimizing logic gates 208 and 210, and so forth.

Estimating Optimal Gate Sizes

Some embodiments described herein provide systems and techniques for estimating optimal gate sizes for a circuit design based on a set of numerical delay models for cells in a technology library. When the gates are optimized in the reverse-levelized order (this process corresponds to operation 112 shown in FIG. 1), an optimal size is estimated for each gate that is being optimized. In some cases, the estimated optimal gate size is used as the optimal gate size, i.e., the gate being optimized is replaced with a gate having the estimated optimal gate size. In some cases, the estimated optimal gate size is provided as a seed (i.e., a starting point) to a numerical solver that iteratively determines a final optimal gate size by using the numerical delay models of cells in the technology library (the numerical solver typically requires only a few iterations to converge on the final optimal gate size).

The problem of determining the optimal sizes of the load gates of a net for best delay can be described as follows: given a net, determine the optimal sizes of the load gates such that the maximum delay from the driver of the net to the outputs of each of the loads of the net is minimized. Note that the delay is minimized when the delays from the driver of the net to the outputs of each of the loads of the net are equal to one another. This is because, if one of the driver-to-load delays, say d1, is greater than the other delays, then the maximum delay over all driver-to-load delays can be reduced by reducing d1. Therefore, the maximum delay over all driver-to-load delays will be minimized when the driver-to-load delays are equal to one another.

Figure 3:
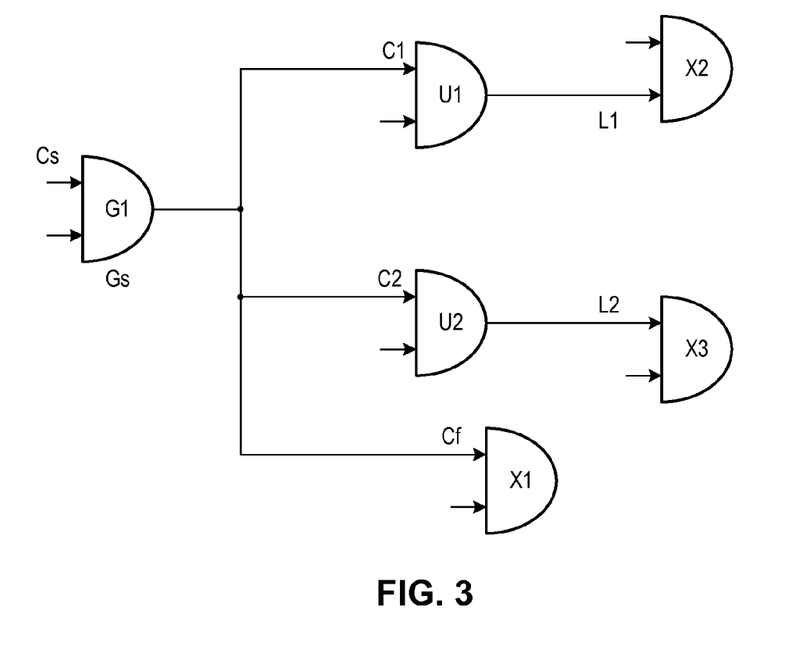
FIG. 3 illustrates how an optimal gate size can be estimated in accordance with some embodiments described herein.

FIG. 3 illustrates how an optimal gate size can be estimated in accordance with some embodiments described herein.

Gates G1, U1-U2, X1-X3 are in a circuit design. The input capacitance of gate G1 is Cs and the specific logical effort of gate G1 is Gs. Each wire in the net shown in FIG. 3 has a parasitic resistance and a parasitic capacitance. Capacitances C1, C2, and Cf are the input capacitances of gates U1, U2, and X1, respectively. Loads L1 and L2 are the loads at the outputs of gates U1 and U2, respectively. Without loss of generality, let us assume that gates U1 and U2 are being optimized. Then, the optimization problem is to determine the sizes of gates U1 and U2 such that the delays from the input of gate G1 to the outputs of gates U1 and U2 are minimized. Stated differently, the optimization problem is to determine the input capacitances C1 and C2 of gates U1 and U2, respectively, such that the delays from the input of gate G1 to the outputs of gates U1 and U2 are minimized.

In some embodiments, the solution to the general form of this problem is determined using a numerical solver. The embodiments described herein provide a closed-form solution that estimates the solution to the general problem with a very good degree of accuracy. The closed-form solution is achieved by making the following assumptions.

First, we assume a worst-case wire delay model where all of the optimizable load gates of the net share the same wire resistance and capacitance. This is similar to some wire-load models that are used for logic optimization (e.g., the "worst-case wire-load models"). A popular wire delay model that is used in physical synthesis systems is the Elmore wire delay model, which was described in Elmore, W. C., "The transient response of damped linear network with particular regard to wideband amplifiers," J. Applied Physics, 19:55-63, 1948. Systems and techniques for efficiently computing Elmore wire delay are described in U.S. patent application Ser. No. 13/485,600, entitled "Incremental Elmore delay calculation," the contents of which are herein incorporated by reference in their entirety. The wire resistance (Rw) and wire capacitance (Cw) can be extracted from the Elmore wire model using the following two alternative approaches:

$$Rw = \sum_{i \in \{all\ wire\ segments\}} r_{w_i} \quad (4)$$

$$Cw = \sum_{i \in \{all\ wire\ segments\}} c_{w_i}$$

and, $$Rw = \max_{k \in \{load\ pins\ of\ the\ net\}} \left( \sum_{i \in \{wire\ segments\ to\ load\ pin\ k\}} r_{w_i} \right) \quad (5)$$

$$Cw = \max_{k \in \{load\ pins\ of\ the\ net\}} \left( \sum_{i \in \{wire\ segments\ to\ load\ pin\ k\}} c_{w_i} \right),$$

where $r_{w_i}$ and $c_{w_i}$ are the parasitic resistances and parasitic capacitances, respectively, of the individual wire segments.

Second, we ignore the self-loading capacitance of gates being optimized. In other words, the delay of a gate is given by $$d = g \cdot \left( \frac{C_o}{C_i} \right),$$

where d is the delay of the gate, g is the generic logical effort of the gate, $C_o$ is the output loading, and Ci is the input capacitance (note that this expression ignores the parasitic delay of the gate).

Although the closed-form solution is derived based on the above two assumptions, the closed-form solution reaches the exact solution when the wire-load model is "worst-case," and the parasitic delay of gates is negligible when compared to the size-dependent delay of gates (i.e., when the value of "p" is negligible when compared to the value of "g·h" in Equation (1)). It also reaches the exact solution for all wire models (including Elmore) when the net has a single fan-out and the parasitic delay of gates is negligible when compared to the size-dependent delay of gates. As mentioned above, in some embodiments, the estimated optimal gate size from the closed-form solution can be used as a near-optimal seed for numerical solver.

Figure 4A:
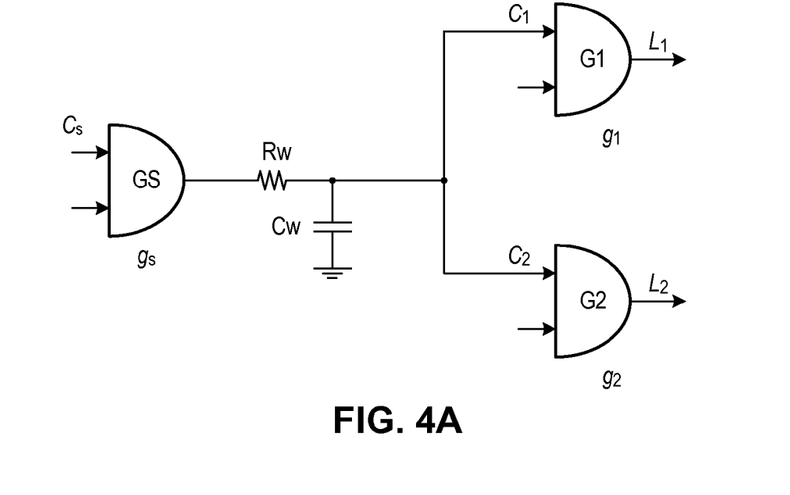
FIG. 4A illustrates a portion of a circuit with two optimizable gates in accordance with some embodiments described herein.

The following description presents the closed-form solution for a net that has two or more optimizable gates. FIG. 4A illustrates a portion of a circuit with two optimizable gates in accordance with some embodiments described herein.

The output of gate GS is electrically coupled to the inputs of gates G1 and G2. Gates G1 and G2 are to be optimized. The wire that electrically couples the output of gate GS with the inputs of gates G1 and G2 is modeled using parasitic resistance $R_w$ and parasitic capacitance $C_w$. The specific logical effort for gate GS is $g_s$, and the generic logical efforts for gates G1 and G2 are $g_1$ and $g_2$, respectively. The input capacitances of gates GS, G1, and G2 are $C_s$, $C_1$, and $C_2$, respectively. The output loads for gates G1 and G2 are $L_1$ and $L_2$, respectively. The delays $D_1$ and $D_2$ from the input of gate GS to the outputs of gates G1 and G2, respectively, are given by:

$$D_1 = g_s \cdot \frac{C_1 + C_2 + C_w}{C_s} + R_w \cdot (C_1 + C_2 + C_w) + g_1 \cdot \frac{L_1}{C_1}, \quad (6)$$

and $$D_2 = g_s \cdot \frac{C_1 + C_2 + C_w}{C_s} + R_w \cdot (C_1 + C_2 + C_w) + g_2 \cdot \frac{L_2}{C_2}.$$

As mentioned before, the delays are minimized when they are equal, i.e., when $D_1 = D_2$. Substituting for $D_1$ and $D_2$ gives us:

$$g_1 \cdot \frac{L_1}{C_1} = g_2 \cdot \frac{L_2}{C_2},$$

or $$C_1 = \frac{g_1 L_1}{g_2 L_2} \cdot C_2.$$

Substituting for $C_1$ in the delay equation for $D_2$ shown above, and simplifying we get:

$$D_2 = \left( \frac{g_s}{c_s} + R_w \right) \cdot \left( C_w + \frac{g_1 L_1}{g_2 L_2} \cdot C_2 + C_2 \right) + \frac{g_2 L_2}{C_2}. \quad (7)$$

Differentiating both sides of Equation (7) with respect to $C_2$, we get:

$$\frac{\partial D_2}{\partial C_2} = \left( \frac{g_s}{c_s} + R_w \right) \cdot \left( \frac{g_1 L_1}{g_2 L_2} + 1 \right) - \frac{g_2 L_2}{(C_2)^2}. \quad (8)$$

$D_2$ achieves a maximum value when the partial derivative shown in Equation (7) is equal to zero. Setting the right hand side in Equation (7) to be equal to zero and simplifying we get:

$$C_2 = \frac{g_2 L_2}{\sqrt{\left(\frac{g_s}{c_s} + R_w\right) \cdot (g_1 L_1 + g_2 L_2)}}. \quad (9)$$

Similarly, an expression can be derived for $C_1$, which is shown below:

$$C_1 = \frac{g_1 L_1}{\sqrt{\left(\frac{g_s}{c_s} + R_w\right) \cdot (g_1 L_1 + g_2 L_2)}}. \quad (10)$$

Figure 4B:
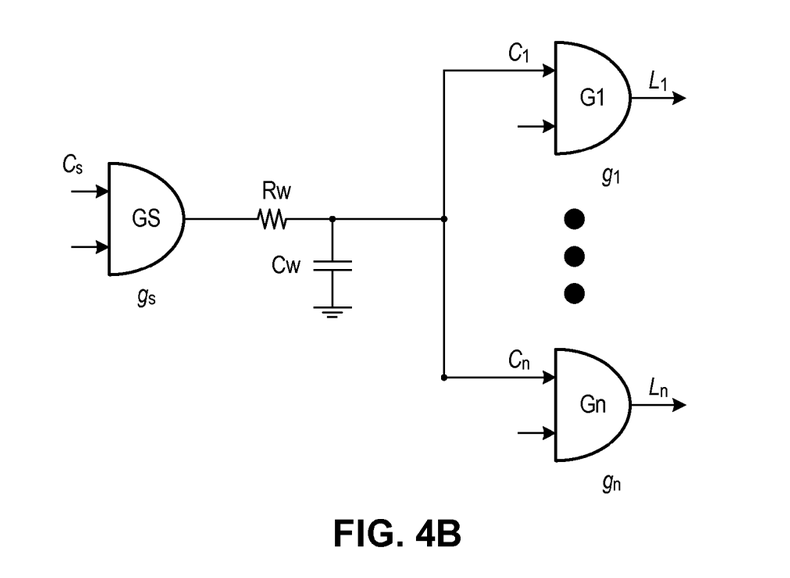
FIG. 4B illustrates a portion of a circuit with n optimizable gates in accordance with some embodiments described herein.

FIG. 4B illustrates a portion of a circuit with n optimizable gates in accordance with some embodiments described herein. For the general case with n optimizable gates G1-Gn having input capacitances $C_1$-$C_n$, generic logical efforts $g_1$-$g_n$, and output loads $L_1$-$L_n$, the optimal input capacitance values $C_i$, $1 \le i \le n$ are given by (note that the input capacitance value represents the gate size):

$$C_i = \frac{g_i L_i}{\sqrt{\left(\frac{g_s}{c_s} + R_w\right) \cdot \left(\sum_{i=1}^{n} g_i L_i\right)}}. \quad (11)$$

Since the gates are optimized in a reverse-levelized order, some of the gates of the net may not be optimized at the same time as the rest of the loads of a net. In a net that has 4 gates, for example, 3 gates may be optimized simultaneously, while the fourth gate is optimized separately (e.g., because the fourth gate is labeled with a different level value).

It is evident from Equation (11) that the best delay to the outputs of the optimizable gates is independent of any fixed capacitive loads on the net. For example, the closed-form solution shown in Equation (11) does not have the term $C_w$, i.e., the optimal gate sizes are independent of the total capacitance ($C_w$) of the net that interconnects the driver gate to the load gates.

However, ignoring the fixed load (e.g., a gate that is not being optimized) would produce bad delays to the output of the fixed load which may be constrained, and would therefore lead to bad overall circuit timing. The sizing problem can be viewed as determining optimal division of the finite driver current provided by the driver gate (e.g., gate GS in FIG. 4) to all load gates (e.g., gates G1-G2 in FIG. 4) in the net. The closed-form solution shown in Equation (11) assumes that the all of the drive current of the driver gate is available for distribution among the optimizable gates only.

Some embodiments overcomes the above-described problem with Equation (11) by assuming that the fixed loads are sized through a virtual buffer that is on the optimized net and drives all fixed loads. The following description presents a close-formed solution that solves the above-described problem with Equation (11).

Let $L_f$ be the sum of all input capacitances of gates that are not being optimized, i.e., let $$L_f = \sum_{j \in \{fixed\ gates\}} C_j^f.$$

Let $g_{buf}$ be the logical effort for a buffer. Then, the buffer can be treated as a gate that is also being optimized and that has an output load of $L_f$. The estimates for the optimal input capacitances can be expressed as follows:

$$C_i = \frac{g_i L_i}{\sqrt{\left(\frac{g_s}{c_s} + R_w\right) \cdot \left(g_{buf} L_f + \sum_{i=1}^{n} g_i L_i\right)}}. \quad (12)$$

Figure 5:
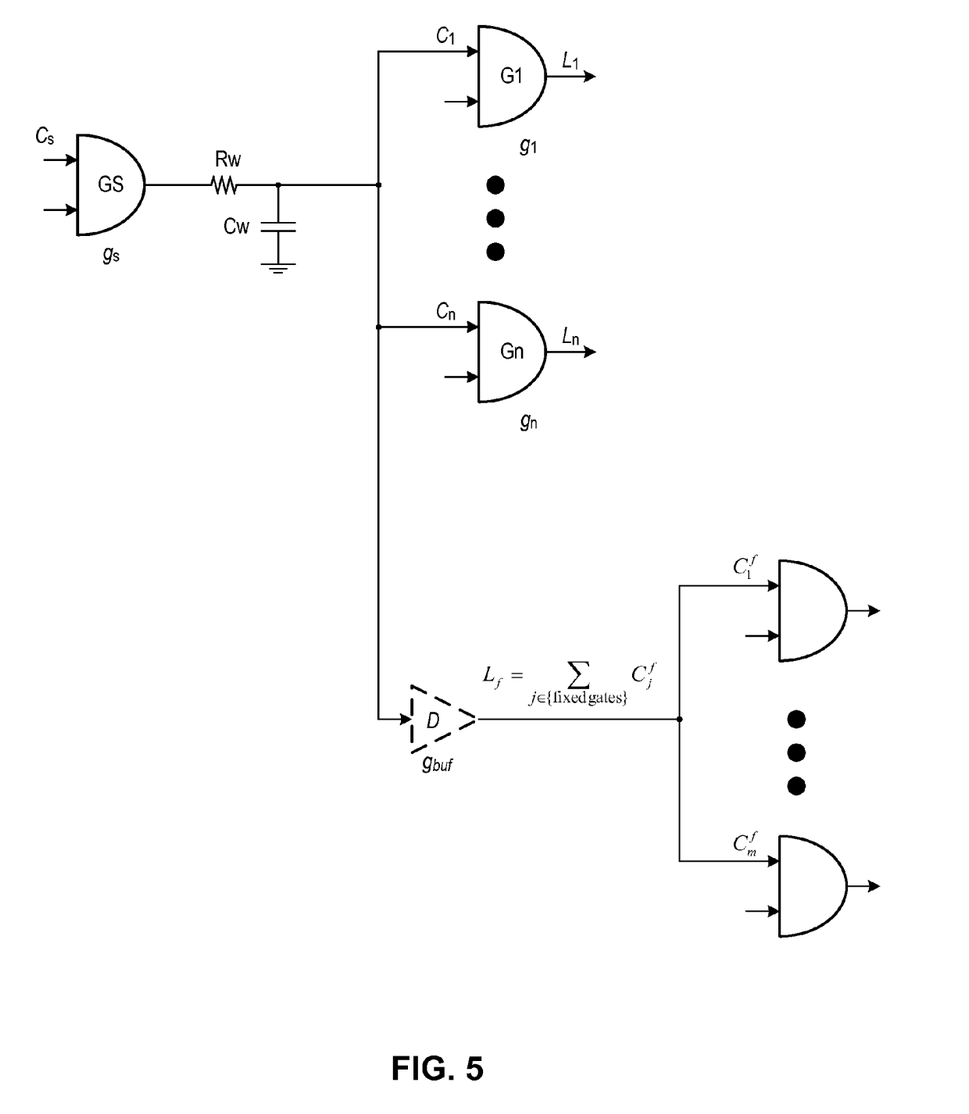
FIG. 5 illustrates a portion of a circuit with n optimizable gates and a fixed load in accordance with some embodiments described herein.

FIG. 5 illustrates a portion of a circuit with n optimizable gates and a fixed load in accordance with some embodiments described herein. Specifically, FIG. 5 illustrates a portion of a circuit that corresponds to Equation (11). As shown in FIG. 5, virtual driver D has a logical effort of $g_{buf}$ and the output load on virtual driver D is equal to the sum of the input capacitances $C_j^f$, $1 \le j \le m$, where m is the number of fixed gates. Note that virtual driver D does not actually exist in the circuit design. The reason for adding virtual driver D is to ensure that the resulting closed-form expression distributes the drive current optimally between the gates that are being optimized and the fixed loads.

Figure 6:
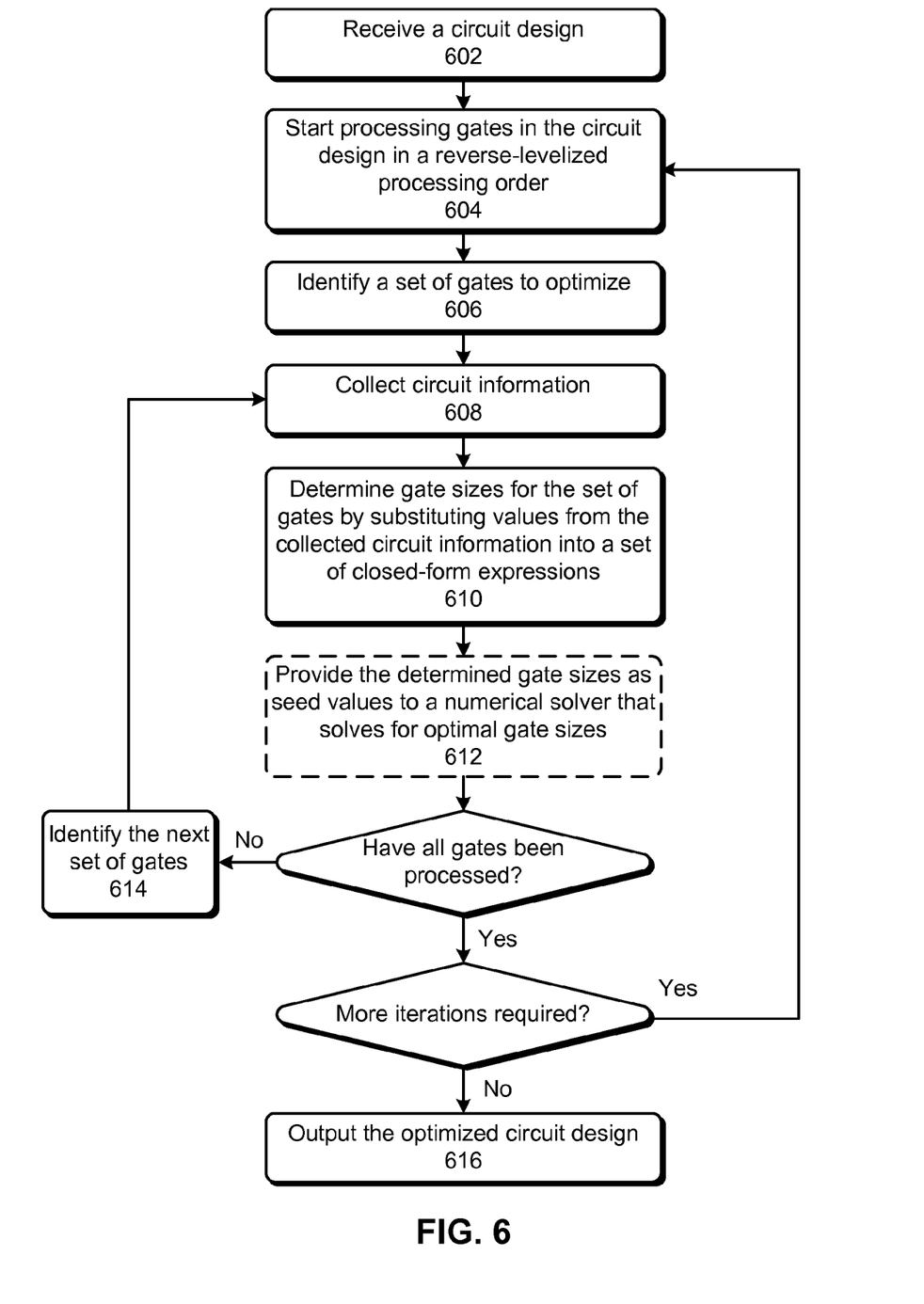
FIG. 6 illustrates a process for optimizing a circuit design in accordance with some embodiments described herein.

FIG. 6 illustrates a process for optimizing a circuit design in accordance with some embodiments described herein. An embodiment (e.g., a computer system) can perform the process, which begins by receiving a circuit design (operation 602). The circuit design can generally be at any abstraction level, e.g., the circuit design can be a logical design or a physical design.

Next, the embodiment starts processing gates in the circuit design in a reverse-levelized processing order (operation 604). The meaning of reverse-levelized processing order was explained above in reference to FIG. 2. When processing gates in reverse-levelized processing order, the embodiment identifies a set of gates to optimize (operation 606). For example, the embodiment may identify gates U1 and U2 shown in FIG. 3 for optimization.

Next, the embodiment collects (e.g., by retrieving values stored in memory locations) circuit information (operation 608). The circuit information includes generic logical effort values of each gate in the set of gates ($g_i$), an input capacitance value ($C_s$) and a specific logical effort value ($g_s$) of a driver gate that drives one or more inputs of each gate in the set of gates, and a wire resistance value ($R_w$) of a net that electrically connects an output of the driver gate with one or more inputs of each gate in the set of gates. The circuit information can additionally include a generic logical effort value ($g_{buf}$) for a virtual driver gate, and a fixed load value ($L_f$) as seen by the virtual driver gate. The fixed load value is equal to a sum of input capacitances ($C_j^f$) of gates that are not in the set of gates that is currently being optimized but whose inputs are electrically connected to the output of the driver gate, i.e., $$L_f = \sum_{j \in \{fixed\ gates\}} C_j^f.$$

The embodiment then determines gate sizes for the set of gates by substituting values from the collected circuit information into a set of closed-form expressions (operation 610). Equations (11) and (12) are two examples of closed-form expressions that can be used to determine gate sizes. It will be apparent to those skilled in the art that many variations and modifications of Equations (11) and (12) can be used instead.

In some embodiments, a closed-form expression is represented by a sequence of processor instructions that evaluates the closed-form expression by accessing values stored in certain memory locations (a "memory location" is any unit of data—e.g., a register or a word in a random access memory—that is accessible by a processor). In these embodiments, values from the collected circuit information can be substituted into the closed-form expression by storing the values in the appropriate memory locations that are accessed by the sequence of processor instructions.

If the determined gate sizes are optimal, then they can be used as is. On the other hand, if the determined gate sizes are not optimal, then the determined gate sizes can be provided as seed values to a numerical solver that solves for optimal gate sizes (operation 612). In some embodiments, operation 612 is not performed, i.e., the determined gate sizes are used as is regardless of whether or not they are optimal.

In any case, once the gate sizes have been determined (either by using the closed-form expressions or by using a numerical solver), the embodiment can determine whether or not all gates have been processed. If all gates have not been processed, then the embodiment can identify the next set of gates (operation 614), and return to operation 608. On the other hand, if all gates have been processed, then the embodiment can determine whether or not additional iterations of the optimization process are required. If additional iterations are required, then the embodiment can return to operation 604. On the other hand, if no more iterations are required (e.g., because the gate sizes have converged to an optimal value or some other termination condition has been met), then the embodiment can output the optimized circuit design (operation 616).

Figure 7:
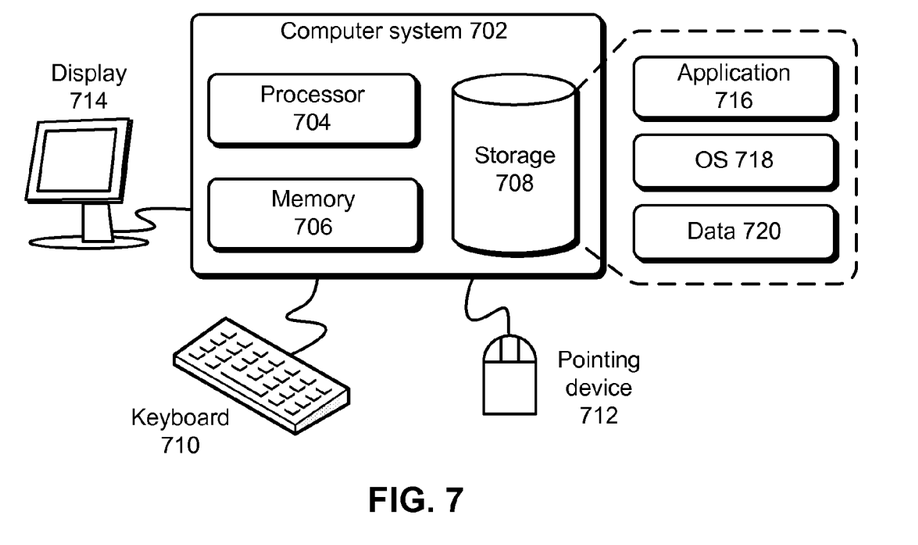
FIG. 7 illustrates a computer system in accordance with an embodiment of the present invention.

FIG. 7 illustrates a computer system in accordance with an embodiment of the present invention.

A computer system can generally be any system that can perform computations. Specifically, a computer system can be a microprocessor, an application specific integrated circuit, a distributed computing system, a cloud computing system, or any other computing system now known or later developed. Computer system 702 comprises processor 704, memory 706, and storage 708. Computer system 702 can be coupled with display 714, keyboard 710, and pointing device 712. Storage 708 can generally be any device that can store data. Specifically, a storage device can be a magnetic, an optical, or a magneto-optical storage device, or it can be based on flash memory and/or battery-backed up memory. Storage 708 can store application 716, operating system 718, and data 720.

Application 716 can include instructions that when executed by computer 702 cause computer 702 to perform one or more processes that are implicitly or explicitly described in this disclosure. Data 720 can include any data that is inputted into or outputted by application 716.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for optimizing a circuit design, the method comprising:
   receiving the circuit design; and
   optimizing, by using a computer, gate sizes in the circuit design in a reverse-levelized processing order, wherein a level associated with a logic gate is greater than the highest level associated with logic gates that are electrically coupled to a fan-in of the logic gate, wherein optimizing logic gates in reverse-levelized processing order comprises optimizing gates in decreasing order of their associated levels, and wherein sizes of a set of gates at a given level in the circuit design are optimized by:
   collecting circuit information, wherein the circuit information includes generic logical effort values of each gate in the set of gates, an input capacitance value and a specific logical effort value of a driver gate that drives one or more inputs of each gate in the set of gates, and a wire resistance value of a net that electrically connects an output of the driver gate with one or more inputs of each gate in the set of gates, wherein a specific logical effort value is a logical effort value of a timing arc of a library cell or an average of logical effort values of multiple timing arcs of the library cell, and wherein a generic logical effort value is a logical effort value a timing arc of a library cell type or an average of logical effort values of multiple timing arcs of the library cell type, and
   determining gate sizes for the set of gates by substituting values from the collected circuit information into a set of closed-form expressions.

2. The method of claim 1, wherein the collected circuit information includes a generic logical effort value for a virtual driver gate, and a fixed load value as seen by the virtual driver gate.

3. The method of claim 2, wherein the fixed load value is equal to a sum of input capacitances of gates that are not in the set of gates that is currently being optimized but whose inputs are electrically connected to the output of the driver gate.

4. The method of claim 1, wherein the wire resistance value of the net is determined using an Elmore wire delay model.

5. The method of claim 1, wherein said optimizing further comprises providing the gate sizes for the set of gates as seed values to a numerical solver that solves for optimal gate sizes.

6. The method of claim 1, wherein said optimizing includes performing multiple optimization iterations, wherein in each optimization iteration all of the gates in the circuit design are processed in the reverse-levelized processing order.

7. A non-transitory computer-readable storage-medium storing instructions that, when executed by a computer system, cause the computer system to perform a method for optimizing a circuit design, the method comprising:
receiving the circuit design; and
optimizing gate sizes in the circuit design in a reverse-levelized processing order, wherein a level associated with a logic gate is greater than the highest level associated with logic gates that are electrically coupled to a fan-in of the logic gate, wherein optimizing logic gates in reverse-levelized processing order comprises optimizing gates in decreasing order of their associated levels, and wherein sizes of a set of gates at a given level in the circuit design are optimized by:
collecting circuit information, wherein the circuit information includes generic logical effort values of each gate in the set of gates, an input capacitance value and a specific logical effort value of a driver gate that drives one or more inputs of each gate in the set of gates, and a wire resistance value of a net that electrically connects an output of the driver gate with one or more inputs of each gate in the set of gates, wherein a specific logical effort value is a logical effort value of a timing arc of a library cell or an average of logical effort values of multiple timing arcs of the library cell, and wherein a generic logical effort value is a logical effort value a timing arc of a library cell type or an average of logical effort values of multiple timing arcs of the library cell type, and
determining gate sizes for the set of gates by substituting values from the collected circuit information into a set of closed-form expressions.

8. The non-transitory computer-readable storage-medium of claim 7, wherein the collected circuit information includes a generic logical effort value for a virtual driver gate, and a fixed load value as seen by the virtual driver gate.

9. The non-transitory computer-readable storage-medium of claim 8, wherein the fixed load value is equal to a sum of input capacitances of gates that are not in the set of gates that is currently being optimized but whose inputs are electrically connected to the output of the driver gate.

10. The non-transitory computer-readable storage-medium of claim 7, wherein the wire resistance value of the net is determined using an Elmore wire delay model.

11. The non-transitory computer-readable storage-medium of claim 7, wherein said optimizing further comprises providing the gate sizes for the set of gates as seed values to a numerical solver that solves for optimal gate sizes.

12. The non-transitory computer-readable storage-medium of claim 7, wherein said optimizing includes performing multiple optimization iterations, wherein in each optimization iteration all of the gates in the circuit design are processed in the reverse-levelized processing order.

13. A computer system, comprising:
a processor; and
a computer-readable storage-medium storing instructions executable by the processor, the instructions comprising:
instructions for receiving the circuit design; and
instructions for optimizing gate sizes in the circuit design in a reverse-levelized processing order, wherein a level associated with a logic gate is greater than the highest level associated with logic gates that are electrically coupled to a fan-in of the logic gate, wherein optimizing logic gates in reverse-levelized processing order comprises optimizing gates in decreasing order of their associated levels, and wherein sizes of a set of gates at a given level in the circuit design are optimized by:
collecting circuit information, wherein the circuit information includes generic logical effort values of each gate in the set of gates, an input capacitance value and a specific logical effort value of a driver gate that drives one or more inputs of each gate in the set of gates, and a wire resistance value of a net that electrically connects an output of the driver gate with one or more inputs of each gate in the set of gates, wherein a specific logical effort value is a logical effort value of a timing arc of a library cell or an average of logical effort values of multiple timing arcs of the library cell, and wherein a generic logical effort value is a logical effort value a timing arc of a library cell type or an average of logical effort values of multiple timing arcs of the library cell type, and
determining gate sizes for the set of gates by substituting values from the collected circuit information into a set of closed-form expressions.

14. The computer system of claim 13, wherein the collected circuit information includes a generic logical effort value for a virtual driver gate, and a fixed load value as seen by the virtual driver gate.

15. The computer system of claim 14, wherein the fixed load value is equal to a sum of input capacitances of gates that are not in the set of gates that is currently being optimized but whose inputs are electrically connected to the output of the driver gate.

16. The computer system of claim 13, wherein the wire resistance value of the net is determined using an Elmore wire delay model.

17. The computer system of claim 13, wherein the instructions further comprise instructions for providing the gate sizes for the set of gates as seed values to a numerical solver that solves for optimal gate sizes.

18. The computer system of claim 13, wherein the instructions further comprise instructions for performing multiple optimization iterations, wherein in each optimization iteration all of the gates in the circuit design are processed in the reverse-levelized processing order.

* * * * *